(12) United States Patent
Ueki et al.

(10) Patent No.: US 9,947,478 B2
(45) Date of Patent: Apr. 17, 2018

(54) VARIABLE CAPACITANCE DEVICE AND COMMUNICATION APPARATUS

(71) Applicant: Murata Manufacturing Co., Ltd., Nagaokakyo-shi, Kyoto-fu (JP)

(72) Inventors: Noriyuki Ueki, Nagaokakyo (JP); Toshiyuki Nakaiso, Nagaokakyo (JP)

(73) Assignee: Murata Manufacturing Co., Ltd., Kyoto (KE)

(*) Notice: Subject to any disclaimer, the term of this patent is extended or adjusted under 35 U.S.C. 154(b) by 309 days.

(21) Appl. No.: 14/749,919

(22) Filed: Jun. 25, 2015

(65) Prior Publication Data

US 2015/0294795 A1 Oct. 15, 2015

Related U.S. Application Data

(63) Continuation of application No. PCT/JP2013/083695, filed on Dec. 17, 2013.

(30) Foreign Application Priority Data

Mar. 29, 2013 (JP) .................................. 2013-071045

(51) Int. Cl.
*H01G 7/06* (2006.01)
*H01G 4/40* (2006.01)
(Continued)

(52) U.S. Cl.
CPC .............. *H01G 7/06* (2013.01); *H01G 4/40* (2013.01); *H02H 7/16* (2013.01); *H02H 9/005* (2013.01); *H03H 5/02* (2013.01)

(58) Field of Classification Search
CPC .. H01G 7/06; H01G 4/40; H02H 7/16; H02H 9/005
See application file for complete search history.

(56) References Cited

U.S. PATENT DOCUMENTS 6,674,321 B1 * 1/2004 York .................... H01G 7/06
327/334
9,515,750 B2 * 12/2016 Mofidi ............... G06K 7/10336
(Continued)

FOREIGN PATENT DOCUMENTS

JP       11-260667 A    9/1999
JP     2005-064437 A    3/2005
(Continued)

OTHER PUBLICATIONS

Official Communication issued in International Patent Application No. PCT/JP2013/083695, dated Mar. 18, 2014.
(Continued)

*Primary Examiner* — Thienvu Tran
*Assistant Examiner* — Christopher Clark
(74) *Attorney, Agent, or Firm* — Keating & Bennett, LLP

(57) ABSTRACT

A variable capacitance device includes a ferroelectric capacitor, a control terminal, a ground terminal, and a capacitor. The ferroelectric capacitor includes a ferroelectric film and capacitor electrodes sandwiching the ferroelectric film, and its capacitance value is changed according to a control voltage value applied between the capacitor electrodes. The control terminal is connected to a first end of the ferroelectric capacitor. The ground terminal is connected to a second end of the ferroelectric capacitor. The capacitor is connected between the control terminal and the ground terminal, and has a capacitance larger than that of the ferroelectric capacitor.

15 Claims, 6 Drawing Sheets

(51) Int. Cl.
*H03H 5/02* (2006.01)
*H02H 9/00* (2006.01)
*H02H 7/16* (2006.01)

(56) References Cited

U.S. PATENT DOCUMENTS

| | | | |
|---|---|---|---|
| 9,704,847 B2* | 7/2017 | Nakaiso | H01L 27/0248 |
| 2002/0149428 A1* | 10/2002 | Toncich | G01R 27/2694 |
| | | | 330/302 |
| 2006/0018082 A1* | 1/2006 | Yamagata | H01G 5/38 |
| | | | 361/321.2 |
| 2006/0220863 A1* | 10/2006 | Koyama | G08B 13/2402 |
| | | | 340/572.1 |
| 2008/0106350 A1* | 5/2008 | McKinzie | H03H 7/40 |
| | | | 333/17.3 |
| 2009/0146498 A1 | 6/2009 | Kanno | |
| 2009/0295543 A1* | 12/2009 | Kita | G06K 19/0723 |
| | | | 340/10.1 |
| 2010/0056098 A1* | 3/2010 | Kanno | H02J 5/005 |
| | | | 455/343.1 |
| 2014/0225793 A1* | 8/2014 | Ikemoto | H04B 5/0062 |
| | | | 343/748 |
| 2016/0013770 A1* | 1/2016 | Sato | H01G 7/06 |
| | | | 333/185 |
| 2016/0133387 A1* | 5/2016 | Kanno | H04B 5/0075 |
| | | | 307/109 |

FOREIGN PATENT DOCUMENTS

| | | | |
|---|---|---|---|
| JP | 2006-049840 A | 2/2006 | |
| JP | 2006-237239 A | 9/2006 | |
| JP | 2006-295905 A | 10/2006 | |
| JP | 2007-236182 A | 9/2007 | |
| JP | 2009-142043 A | 6/2009 | |
| WO | WO 2013183472 A1 * | 12/2013 | H01G 7/06 |

OTHER PUBLICATIONS

Official Communication issued in corresponding Japanese Patent Application No. 2014-533510, dated Aug. 26, 2014.

* cited by examiner

VARIABLE CAPACITANCE DEVICE AND COMMUNICATION APPARATUS

BACKGROUND OF THE INVENTION

1. Field of the Invention

The present invention relates to a variable capacitance device whose capacitance value is changed by a control voltage value, and a communication apparatus including the same.

2. Description of the Related Art

Various variable capacitance devices whose capacitance values are changed according to a control voltage value have been proposed so far. For example, a variable capacitance device described in JP 11-260667 A has a stacked structure including capacitor electrodes disposed on both surfaces of a dielectric film for obtaining a large capacitance value, while being compact in size.

When a variable capacitance device is used, a control voltage application circuit is connected to a control terminal of the variable capacitance device for applying a control voltage to the variable capacitance device. However, when a high voltage is applied to the control voltage application circuit due to ESD (Electro-Static Discharge), a large surge current flows through the variable capacitance device, which might break the variable capacitance device.

In the case where a variable capacitance device is used for an electronic device for which a high voltage cannot be used, such as a cellular phone, a dielectric film used for the variable capacitance device has to be sufficiently thin in order to obtain a large amount of change in capacitance. In addition, an area of capacitor electrodes that sandwich the dielectric film has to be reduced for miniaturization. However, these restrictions deteriorate ESD resistance of the variable capacitance device.

SUMMARY OF THE INVENTION

Preferred embodiments of the present invention provide a variable capacitance device having high ESD resistance, and a communication apparatus including the same.

A variable capacitance device according to a preferred embodiment of the present invention includes a ferroelectric capacitor including a ferroelectric film and capacitor electrodes sandwiching the ferroelectric film, wherein the ferroelectric film and the capacitor electrodes are configured such that a capacitance value is changed according to a control voltage value applied between the capacitor electrodes; a control terminal connected to a first end of the ferroelectric capacitor; a ground terminal connected to a second end of the ferroelectric capacitor; and a capacitor connected between the control terminal and the ground terminal, and having a capacitance larger than that of the ferroelectric capacitor.

With this configuration, when a high voltage is applied to the control terminal with ESD, almost all surge current generated by the ESD flows into the ground terminal via the capacitor. Specifically, the surge current is shunted by the capacitor, such that the surge current flowing through the ferroelectric capacitor is significantly reduced or prevented. Therefore, this configuration prevents the ferroelectric capacitor from being broken down.

Especially when the ferroelectric thin film included in the ferroelectric capacitor is also used as a capacitance of the capacitor, the variable capacitance device is configured such that an electrode area of the capacitor becomes larger than that of the ferroelectric capacitor. With this, an electric field per unit area applied to the capacitor is reduced, resulting in satisfactory ESD resistance being imparted to the capacitor. In addition, in this case, when the ferroelectric thin films preferably have the same or substantially the same thickness, there is an advantage that the ferroelectric capacitor and the capacitor are able to be simultaneously formed via a stacking technique.

The capacitor preferably is connected between the first end of the ferroelectric capacitor and the ground terminal.

With this configuration, the ESD resistance is enhanced without any change in the design of the ferroelectric capacitor.

The variable capacitance device preferably includes a first resistance connected between the first end of the ferroelectric capacitor and the control terminal; a second resistance connected between the second end of the ferroelectric capacitor and the ground terminal; and a third resistance connected to the capacitor in series.

This configuration prevents a leakage of a high-frequency signal, which is applied to the variable capacitance device, to the control terminal and the ground terminal.

The variable capacitance device preferably includes a first bias line connecting the first end of the ferroelectric capacitor and the control terminal; and a second bias line connecting the second end of the ferroelectric capacitor and the ground terminal, wherein a plurality of the ferroelectric capacitors is connected in series, and the first bias line and the second bias line are alternately connected via the ferroelectric capacitor.

This configuration enhances voltage proof between input/output terminals of the variable capacitance device, while reducing the number of the bias lines to which the control voltage is applied.

The variable capacitance device preferably includes an input/output terminal connected to the ferroelectric capacitor, wherein the capacitor is connected to the input/output terminal via the ferroelectric capacitor.

This configuration prevents a surge current generated due to ESD from flowing into the input/output terminal.

The plurality of the ferroelectric capacitors may be connected in series, and a portion of the ferroelectric capacitors may define the capacitor.

This configuration enhances ESD resistance without additionally providing a capacitor.

A communication apparatus according to a preferred embodiment of the present invention includes an antenna coil, the variable capacitance device according to one of the preferred embodiments of the present invention described above connected to the antenna coil, and an RFIC connected to the variable capacitance device.

With this configuration, a communication apparatus having high ESD resistance is obtained.

According to various preferred embodiments of the present invention, a variable capacitance device having high ESD resistance and a communication apparatus are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
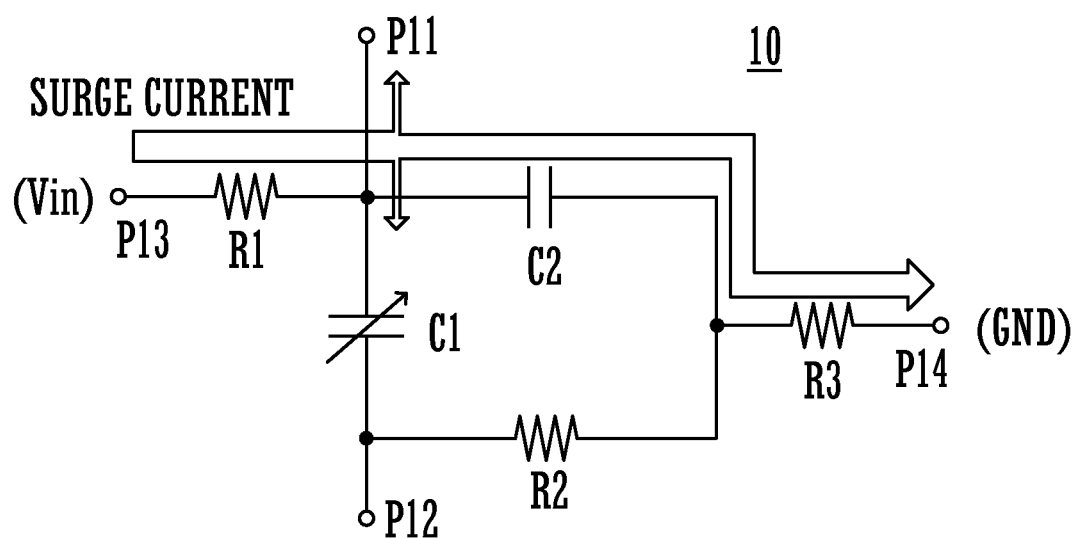
FIG. 1 is a circuit diagram illustrating an inside of a variable capacitance device 10 according to a first preferred embodiment of the present invention.

A variable capacitance device 10 according to a first preferred embodiment of the present invention will be described. FIG. 1 is a circuit diagram illustrating an inside of the variable capacitance device 10. The variable capacitance device includes a ferroelectric capacitor C1, a capacitor C2, resistances R1 to R3, input/output terminals P11 and P12, a control terminal P13, and a ground terminal P14. The resistance R1 corresponds to a first resistance. The resistance R2 corresponds to a second resistance. The resistance R3 corresponds to a third resistance.

A first end of the ferroelectric capacitor C1 is connected to the control terminal P13 via the resistance R1, and also connected to a first end of the capacitor C2 and the input/output terminal P11. A second end of the ferroelectric capacitor C1 is connected to a first end of the resistance R2 and the input/output terminal P12. A second end of the capacitor C2 is connected to a second end of the resistance R2, and its connection point is connected to the ground terminal P14 via the resistance R3. When the variable capacitance device 10 is used, control voltage Vin is applied to the control terminal P13, and the ground terminal P14 is connected to a ground.

The ferroelectric capacitor includes a ferroelectric film and capacitor electrodes sandwiching the ferroelectric film. In the ferroelectric film, an apparent dielectric constant is changed due to a change in a polarization quantity according to intensity of an applied electric field. Therefore, a capacitance value of the ferroelectric capacitor is able to be determined by a control voltage value. Accordingly, in the variable capacitance device 10, a capacitance value between the input/output terminals P11 and P12 is changed by changing the voltage applied to the control terminal P13.

Values of the resistances R1 to R3 preferably are set to be sufficiently larger than a magnitude of an impedance of the ferroelectric capacitor C1 with a frequency of a high-frequency signal applied between the input/output terminals P11 and P12. Thus, the resistances R1 to R3 prevent the high-frequency signal applied between the input/output terminals P11 and P12 from leaking to the control terminal P13 and the ground terminal P14.

The capacitance of the capacitor C2 preferably is set larger than the capacitance of the ferroelectric capacitor C1. With this, when a high voltage with ESD (hereinafter referred to as an ESD voltage) is applied to the control terminal P13, almost all current generated by the ESD (hereinafter referred to as a surge current) flows through the ground terminal through the capacitor C2. Specifically, the surge current is shunted by the capacitor C2, such that the surge current flowing through the ferroelectric capacitor C1 is significantly reduced or prevented. This prevents the ferroelectric capacitor C1 from being broken down.

As described above, a variable capacitance device having high ESD resistance is implemented according to the first preferred embodiment of the present invention.

Figure 2:
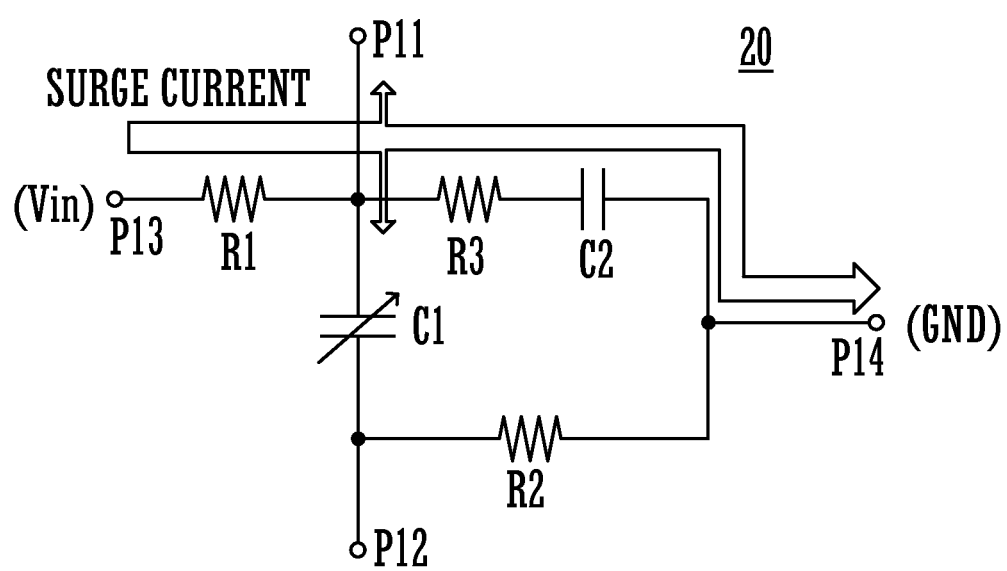
FIG. 2 is a circuit diagram illustrating an inside of a variable capacitance device 20 according to the first preferred embodiment of the present invention.

Notably, the variable capacitance device may be configured as illustrated in FIG. 2. FIG. 2 is a circuit diagram illustrating an inside of a variable capacitance device 20. The first end of the ferroelectric capacitor C1 is connected to the ground terminal via the resistance R3 and the capacitor C2 which are connected in series. The second end of the ferroelectric capacitor C1 is connected to the ground terminal via the resistance R2. The other configuration preferably is the same or substantially the same as the variable capacitance device 10. Even when the resistance R3 is inserted as described above, the effect same as the variable capacitance device 10 is able to be obtained.

When the thickness of the dielectric film used for the capacitor is decreased, an electric field per a unit thickness applied to the capacitor is increased, so that the ESD resistance of the capacitor is deteriorated. On the other hand, when the facing area of the capacitor electrodes sandwiching the dielectric film is increased, an electric field per unit area applied to the capacitor is decreased, so that the ESD resistance of the capacitor is enhanced. In view of this, it is preferable to increase the facing area of the capacitor electrodes involved with the capacitor C2 to increase the capacitance of the capacitor C2. With this, the capacitor C2 having high ESD resistance and large capacitance is obtained.

The variable capacitance device 10 also preferably has a stacked structure in which an electrode pattern and a ferroelectric thin film are stacked, for example. The ferroelectric capacitor C1 and the capacitor C2 are preferably provided in the same layer in the stacked structure. Specifically, the ferroelectric film used for the ferroelectric capacitor C1 is also used for the capacitor C2. The facing area of the capacitor electrodes involved with the capacitor C2 is wider than the facing area of the capacitor electrodes involved with the ferroelectric capacitor C1.

In this structure, the thickness of the dielectric film involved with the capacitor C2 and the thickness of the dielectric film involved with the ferroelectric capacitor C1 are preferably equal or substantially equal to each other. The facing area of the capacitor electrodes involved with the capacitor C2 becomes wider than the facing area of the capacitor electrodes involved with the ferroelectric capacitor C1. Therefore, the capacitor C2 having high ESD resistance and large capacitance is obtained as described above. In addition, the ferroelectric capacitor C1 and the capacitor C2 are able to be simultaneously formed via a stacking process.

Second Preferred Embodiment

Figure 3:
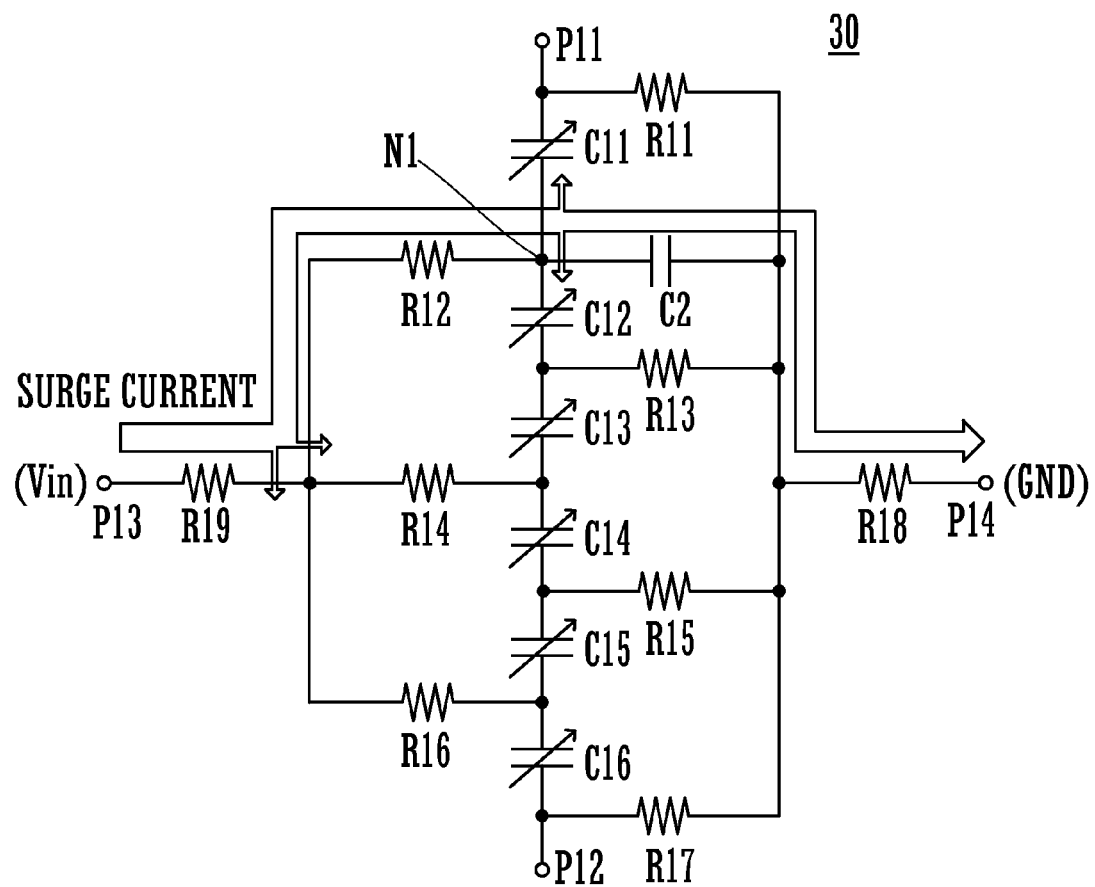
FIG. 3 is a circuit diagram illustrating an inside of a variable capacitance device 30 according to a second preferred embodiment of the present invention.

A variable capacitance device 30 according to a second preferred embodiment of the present invention will be described. FIG. 3 is a circuit diagram illustrating an inside of the variable capacitance device 30. The variable capacitance device 30 includes ferroelectric capacitors C11 to C16, a capacitor C2, resistances R11 to R19, input/output terminals P11 and P12, a control terminal P13, and a ground terminal P14.

The ferroelectric capacitors C11 to C16 are connected in series in this order between the input/output terminals P11 and P12. A connection point between the ferroelectric capacitor C11 and the ferroelectric capacitor C12 is connected to a first end of the resistance R19 via the resistance R12, and also connected to a first end of the resistance R18 via the capacitor C2. A connection point between the ferroelectric capacitor C13 and the ferroelectric capacitor C14 is connected to the first end of the resistance R19 via the resistance R14. A connection point between the ferroelectric capacitor C15 and the ferroelectric capacitor C16 is connected to the first end of the resistance R19 via the resistance R16.

A connection point between the input/output terminal P11 and the ferroelectric capacitor C11 is connected to a first end of the resistance R18 via the resistance R11. A connection point between the ferroelectric capacitor C12 and the ferroelectric capacitor C13 is connected to the first end of the resistance R18 via the resistance R13. A connection point between the ferroelectric capacitor C14 and the ferroelectric capacitor C15 is connected to the first end of the resistance R18 via the resistance R15. A connection point between the input/output terminal P12 and the ferroelectric capacitor C16 is connected to the first end of the resistance R18 via the resistance R17.

A second end of the resistance R18 is connected to the ground terminal P14. A second end of the resistance R19 is connected to the control terminal P13.

A line including the resistances R12, R14, and R16 corresponds to a "first bias line". A line including the resistances R11, R13, R15, and R17 corresponds to a "second bias line".

As in the first preferred embodiment, the capacitance value between the input/output terminals P11 and P12 is determined according to the voltage applied between the control terminal P13 and the ground terminal P14 in the variable capacitance device 30. The resistances R11 to R19 prevent the high-frequency signal applied between the input/output terminals P11 and P12 from leaking to the control terminal P13 and the ground terminal P14. The capacitor C2 shunts the surge current to prevent the ferroelectric capacitors C11 to C16 from being broken down by the ESD.

Similar to the first preferred embodiment, the second preferred embodiment provides a variable capacitance device having high ESD resistance.

The capacitor C2 is connected between the ferroelectric capacitors connected in series. This structure prevents the surge current from flowing into the input/output terminals P11 and P12, compared to the case where the capacitor C2 is connected between the ferroelectric capacitor and the input/output terminals.

In the second preferred embodiment, the capacitor C2 is additionally provided between the resistance R12 and the resistance R18. However, the connection position of the capacitor C2 is not limited thereto. The capacitor C2 may be located between the resistance R14 and the resistance R18, or between the resistance R16 and the resistance R18. The connection position of the capacitor is not limited to one position. The capacitor may be provided at two or more positions.

Figure 4:
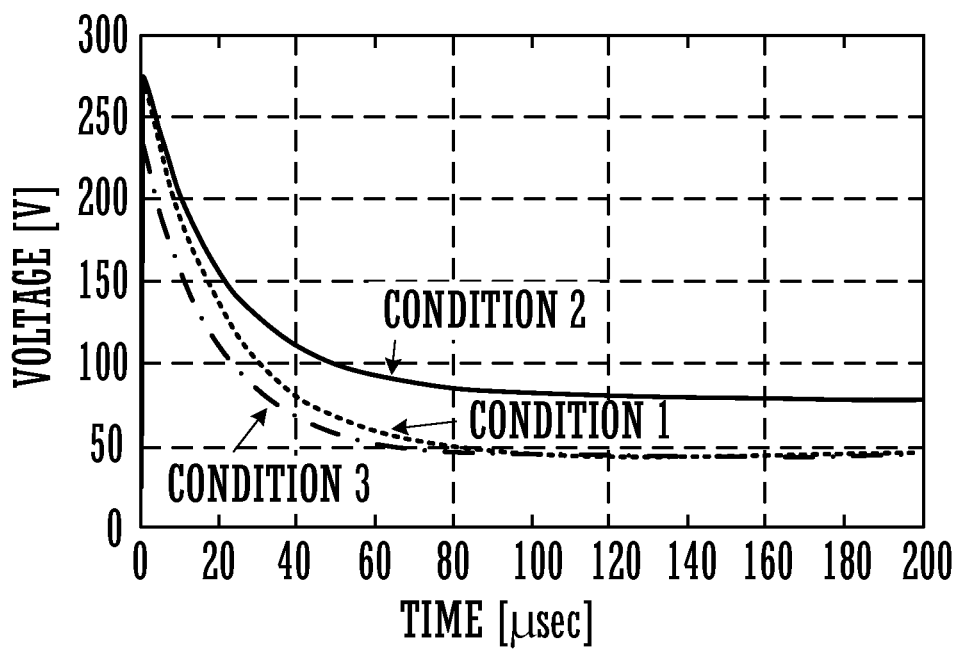
FIG. 4 is diagram illustrating a change in voltage values, when an ESD voltage is applied.

FIG. 4 is a diagram illustrating a change in voltage values upon an application of an ESD voltage. A calculation result with HBM (Human Body Model) is illustrated here. An ESD voltage of about 1 kV is preferably applied between the control terminal P13 and the ground terminal P14, for example. The resistances R11 to R19 preferably are respectively set to about 50 kΩ, for example.

In a condition 1, the capacitor C2 is eliminated from the structure of the variable capacitance device 30. The capacitances of the ferroelectric capacitors C11 to C16 preferably are respectively set to about 360 pF, for example. In a condition 2, the capacitor C2 is eliminated from the structure of the variable capacitance device 30. The capacitances of the ferroelectric capacitors C11 to C16 preferably are respectively set to about 180 pF, for example. In a condition 3, the capacitance of the capacitor C2 preferably is set to about 100 pF, and the capacitances of the ferroelectric capacitors C11 to C16 preferably are respectively set to about 180 pF, for example. In the conditions 1 to 3, the facing area of the capacitor electrodes sandwiching the ferroelectric film is changed, with the thickness of the ferroelectric film forming the ferroelectric capacitor being fixed, to change the capacitance of the ferroelectric capacitor.

A vertical axis indicates a voltage value at a connection point N1 between the resistance R12 and the capacitor C2 (see FIG. 3). A horizontal axis indicates an elapsed time from the start of the application of the ESD voltage.

The voltage value in the condition 1 attenuates to become about 40 V for about 200 μsec after the application of the ESD voltage, for example. The voltage value in the condition 2 attenuates more gently than the calculation result 1 to become about 80 V for about 200 μsec, for example. The voltage value in the condition 3 attenuates more sharply than the conditions 1 and 2 to become about 40 V for about 200 μsec, for example.

Specifically, the ESD resistance of the variable capacitance device in the condition 2 is more deteriorated than the condition 1. On the other hand, the ESD resistance of the variable capacitance device in the condition 3 becomes equal to or higher than the condition 1, although the facing area of the capacitor electrodes is decreased.

Third Preferred Embodiment

Figure 5:
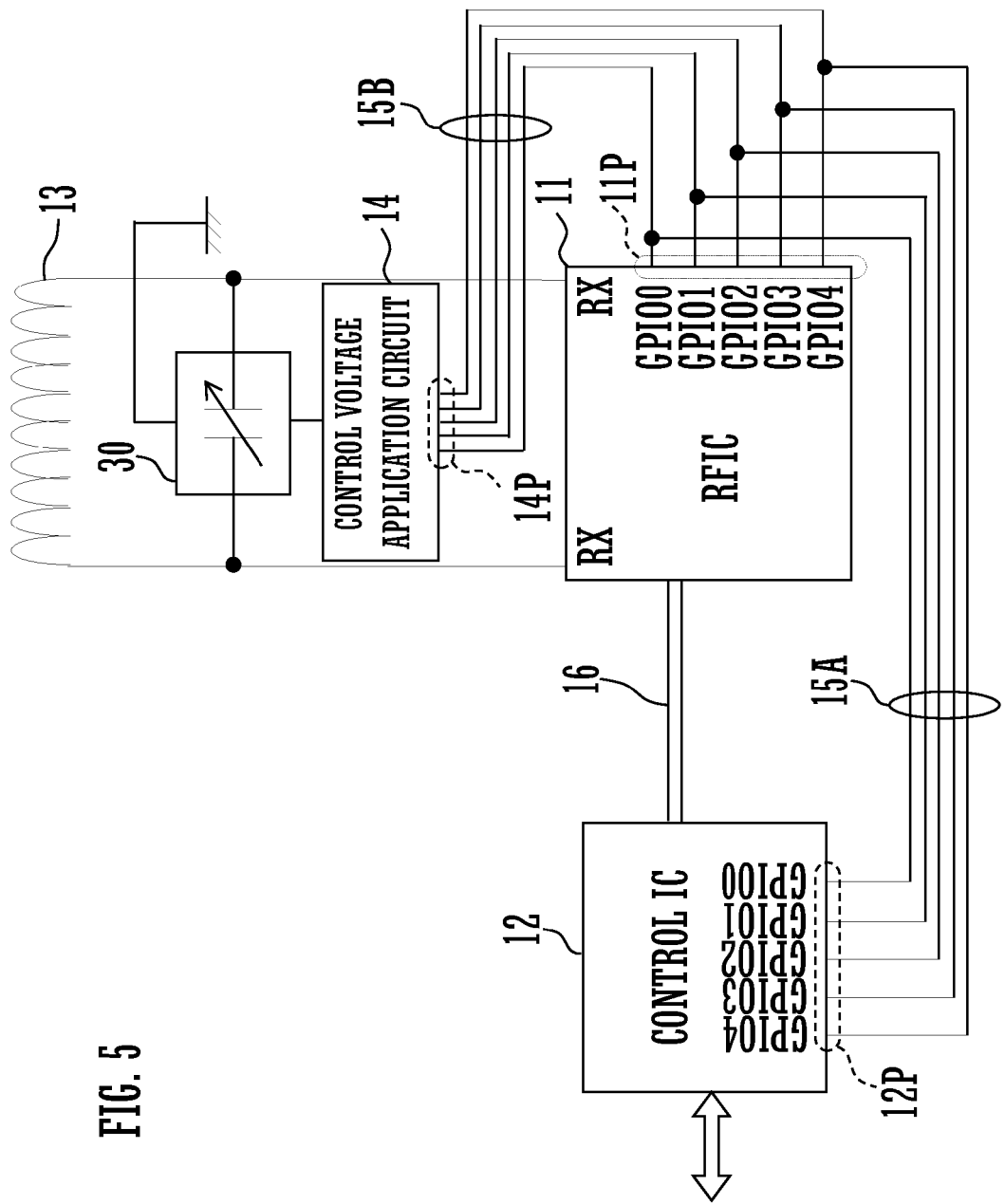
FIG. 5 is a circuit diagram illustrating a communication apparatus 101 according to a third preferred embodiment of the present invention.

A communication apparatus 101 according to a third preferred embodiment of the present invention will be described. FIG. 5 is a circuit diagram illustrating the communication apparatus 101. The communication apparatus 101 includes an RFIC 11, a control IC 12, an antenna coil 13, a control voltage application circuit 14, and the variable capacitance device 30 according to the second preferred embodiment.

The RFIC 11 includes an IO terminal 11P of GPIO (General Purpose Input/Output). Similarly, the control IC 12 includes an IO terminal 12P of GPIO.

The RFIC 11 performs transformation between a base band signal and a high-frequency signal. The control IC 12 controls the RFIC 11 to input/output data containing communication data.

The control voltage application circuit 14 divides a voltage inputted to the input terminal 14P to generate a control voltage, and applies this control voltage to the variable capacitance device 30.

A parallel circuit including the variable capacitance device 30 and the antenna coil 13 is connected to two RX terminals (received signal terminals) of the RFIC 11.

An IO terminal 11P of the RFIC 11 and an IO terminal 12P of the control IC 12 are connected with a signal line 15A, and an input terminal 14P of the control voltage application circuit 14 is connected to signal lines 15A and 15B.

The RFIC 11 and the control IC 12 input and output a communication signal via a data transfer line 16. The control IC 12 performs controls such as various settings of the RFIC 11 via the signal line 15A. The RFIC 11 or the control IC 12 applies control data to the variable capacitance device 30 via the signal lines 15A and 15B and the control voltage application circuit 14.

The variable capacitance device 30 defines an antenna circuit, which is an LC parallel resonance circuit, with the antenna coil 13, and determines a resonance frequency of the antenna circuit to a predetermined frequency. The antenna coil 13 is electromagnetically coupled to an antenna of a communication counterpart to perform reception and transmission for short-range communication.

The third preferred embodiment provides a communication apparatus having high ESD resistance by using a variable capacitance device having high ESD resistance.

Fourth Preferred Embodiment

Figure 6:
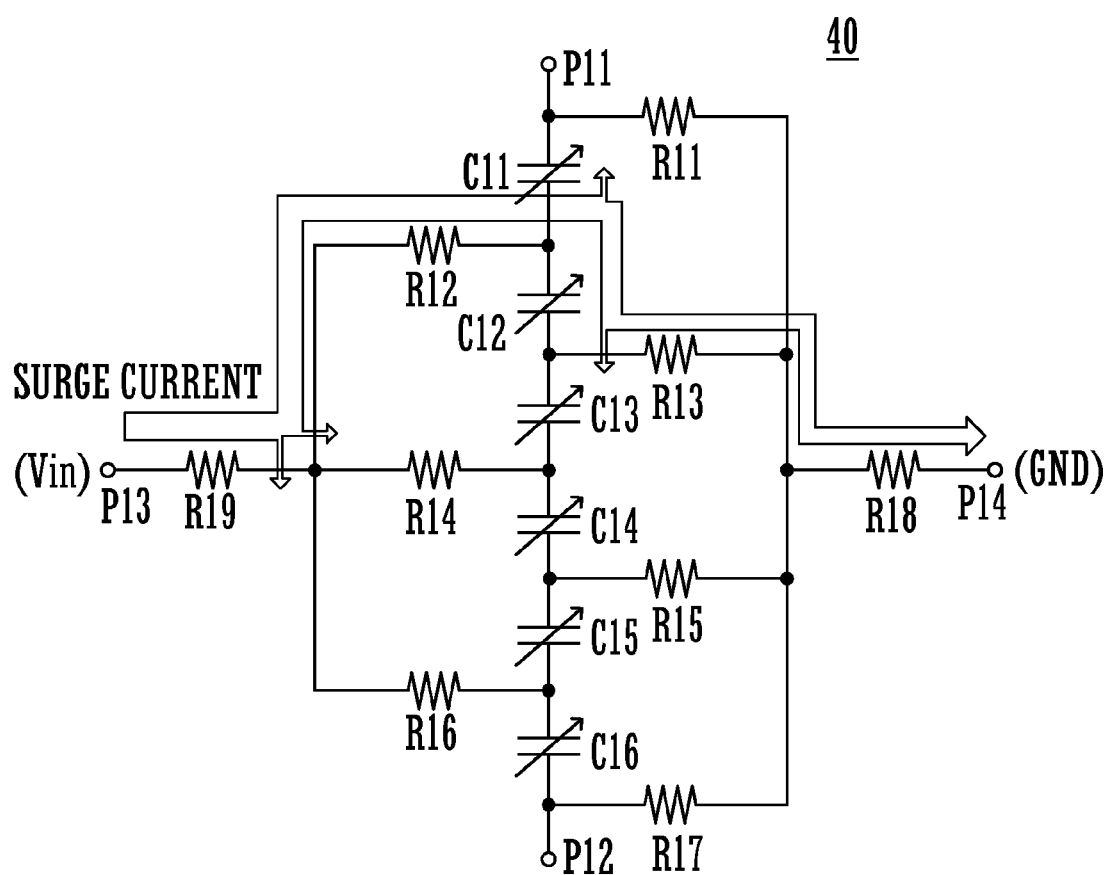
FIG. 6 is a circuit diagram illustrating an inside of a variable capacitance device 40 according to a fourth preferred embodiment of the present invention.

A variable capacitance device 40 according to a fourth preferred embodiment of the present invention will be described. FIG. 6 is a circuit diagram illustrating an inside of the variable capacitance device 40. Capacitance of the ferroelectric capacitor C12 is larger than the capacitances of the ferroelectric capacitors C11 and C13 to C16. For example, the capacitance of the ferroelectric capacitor C12 is increased by increasing the facing area of the capacitor electrodes sandwiching the ferroelectric film with the thickness of the ferroelectric film forming the ferroelectric capacitor C12 being fixed. The variable capacitance device 40 does not include the capacitor C2 according to the second preferred embodiment. The other configuration is preferably the same or substantially the same as the second preferred embodiment.

According to the fourth preferred embodiment, the ferroelectric capacitor C12 defines and functions as the capacitor C2 according to the second preferred embodiment. Specifically, since a surge current is shunted by the ferroelectric capacitor C12, it hardly flows into the ferroelectric capacitors C11 and C13 to C16. This prevents the ferroelectric capacitors C11 and C13 to C16 from being broken down with ESD. With this, a variable capacitance device having high ESD resistance is provided. In addition, the effect same as the second preferred embodiment is obtained.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A variable capacitance device comprising:
a signal line connecting input/output terminals;
a ferroelectric capacitor including a ferroelectric film and capacitor electrodes sandwiching the ferroelectric film and being inserted into the signal line between the input/output terminals, the ferroelectric film and capacitor electrodes being configured such that a capacitance value is changed according to a control voltage value applied between the capacitor electrodes;
a control terminal connected to a first end of the ferroelectric capacitor;
a ground terminal connected to a second end of the ferroelectric capacitor; and
a capacitor connected between the signal line at the first end of the ferroelectric capacitor and the ground terminal, having a capacitance larger than that of the ferroelectric capacitor, and configured such that a capacitance value is not changed.

2. The variable capacitance device according to claim 1, further comprising:
a first resistance connected between the first end of the ferroelectric capacitor and the control terminal;
a second resistance connected between the second end of the ferroelectric capacitor and the ground terminal; and
a third resistance connected to the capacitor in series, the capacitor being configured such that a capacitance value is not changed.

3. The variable capacitance device according to claim 1, further comprising:
a first bias line connecting the first end of the ferroelectric capacitor and the control terminal; and
a second bias line connecting the second end of the ferroelectric capacitor and the ground terminal; wherein
a plurality of the ferroelectric capacitors are connected in series; and
the first bias line and the second bias line are alternately connected via the ferroelectric capacitors.

4. The variable capacitance device according to claim 3, wherein
the capacitor configured such that a capacitance value is not changed is connected to one of the input/output terminals via one of the ferroelectric capacitors.

5. The variable capacitance device according to claim 3, wherein the plurality of the ferroelectric capacitors have different capacitances from each other.

6. A communication apparatus comprising:
an antenna coil;
a variable capacitance device connected to the antenna coil; and
an RFIC connected to the variable capacitance device; wherein
the variable capacitance device is the variable capacitance device according to claim 1.

7. The communication apparatus according to claim 6, further comprising a control IC configured to control the RFIC to input/output data.

8. The communication apparatus according to claim 6, further comprising a control voltage application circuit configured to apply a voltage to the variable capacitance device.

9. The communication apparatus according to claim 6, wherein the RFIC is configured to perform transformation between a base band signal and a high-frequency signal.

10. The communication apparatus according to claim 6, wherein the variable capacitance device defines an antenna circuit with the antenna coil.

11. The communication apparatus according to claim 10, wherein the antenna circuit is an LC parallel resonance circuit.

12. The communication apparatus according to claim 6, further comprising:
a first resistance connected between the first end of the ferroelectric capacitor and the control terminal;
a second resistance connected between the second end of the ferroelectric capacitor and the ground terminal; and
a third resistance connected to the capacitor in series, the capacitor being configured such that a capacitance value is not changed.

13. The communication apparatus according to claim 6, further comprising:
a first bias line connecting the first end of the ferroelectric capacitor and the control terminal; and a second bias line connecting the second end of the ferroelectric capacitor and the ground terminal; wherein a plurality of the ferroelectric capacitors are connected in series; and the first bias line and the second bias line are alternately connected via the ferroelectric capacitors.

14. The communication apparatus according to claim 13, wherein the capacitor configured such that a capacitance value is not changed is connected to an input/output terminal via the ferroelectric capacitor.

15. The communication apparatus according to claim 13, wherein the plurality of the ferroelectric capacitors have different capacitances from each other.

* * * * *

UNITED STATES PATENT AND TRADEMARK OFFICE
CERTIFICATE OF CORRECTION

PATENT NO. : 9,947,478 B2
APPLICATION NO. : 14/749919
DATED : April 17, 2018
INVENTOR(S) : Noriyuki Ueki et al.

It is certified that error appears in the above-identified patent and that said Letters Patent is hereby corrected as shown below:

On the Title Page

In Item (73) Assignee, change "Murata Manufacturing Co., Ltd., Kyoto (KE)" to --Murata Manufacturing Co., Ltd., Kyoto (JP)--.

Signed and Sealed this
Fifth Day of March, 2019

Andrei Iancu
*Director of the United States Patent and Trademark Office*